US011303209B2

(12) United States Patent
Ikeda

(10) Patent No.: US 11,303,209 B2
(45) Date of Patent: Apr. 12, 2022

(54) POWER MODULE AND DC-DC CONVERTER

(71) Applicant: NIDEC CORPORATION, Kyoto (JP)

(72) Inventor: Hidetoshi Ikeda, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 51 days.

(21) Appl. No.: 16/638,467

(22) PCT Filed: Sep. 10, 2018

(86) PCT No.: PCT/JP2018/033357
§ 371 (c)(1),
(2) Date: Feb. 12, 2020

(87) PCT Pub. No.: WO2019/065173
PCT Pub. Date: Apr. 4, 2019

(65) Prior Publication Data
US 2020/0366199 A1 Nov. 19, 2020

(30) Foreign Application Priority Data
Sep. 29, 2017 (JP) .............................. JP2017-191841

(51) Int. Cl.
| | |
|---|---|
| *H02M 3/158* | (2006.01) |
| *G01R 19/00* | (2006.01) |
| *H01L 25/18* | (2006.01) |
| *H02M 1/08* | (2006.01) |
| *H02M 1/00* | (2006.01) |

(52) U.S. Cl.
CPC ........ *H02M 3/158* (2013.01); *G01R 19/0092* (2013.01); *H01L 25/18* (2013.01); *H02M 1/08* (2013.01); *H02M 1/0009* (2021.05)

(58) Field of Classification Search
CPC ........ H02M 3/156; H02M 3/158; H02M 1/32; H02M 1/0032; H02M 1/0009; H02M 1/0025
See application file for complete search history.

(56) References Cited

U.S. PATENT DOCUMENTS

| | | | |
|---|---|---|---|
| 2007/0019450 A1* | 1/2007 | Tiew ..................... | H02M 3/156 363/98 |
| 2009/0039869 A1 | 2/2009 | Williams | |
| 2013/0162232 A1 | 6/2013 | Itoh | |

(Continued)

FOREIGN PATENT DOCUMENTS

| | | |
|---|---|---|
| JP | H11-265974 A | 9/1999 |
| JP | 2012-65483 A | 3/2012 |

(Continued)

*Primary Examiner* — Rafael O De Leon De Domenech
(74) *Attorney, Agent, or Firm* — Hauptman Ham, LLP

(57) ABSTRACT

A power module includes: a first switching device; a current-voltage conversion circuit into which current output from the first switching device flows; a measurement circuit that measures magnitude of the current; and an output terminal that outputs an output signal indicating the magnitude of the current measured by the measurement circuit. The measurement circuit measures the magnitude of the current output from the first switching device based on a resistance value of the current-voltage conversion circuit, and the first switching device and the measurement circuit are implemented in one semiconductor package.

7 Claims, 4 Drawing Sheets

(56) References Cited

U.S. PATENT DOCUMENTS

| | | | | |
|---|---|---|---|---|
| 2014/0070786 A1* | 3/2014 | Guerra | ............... | G05F 1/618 |
| | | | | 323/285 |
| 2016/0172279 A1* | 6/2016 | Cho | ............... | H01L 24/37 |
| | | | | 257/76 |
| 2016/0365721 A1 | 12/2016 | Soma et al. | | |

FOREIGN PATENT DOCUMENTS

| | | |
|---|---|---|
| JP | 2014-193022 A | 10/2014 |
| JP | 2016-163512 A | 9/2016 |

* cited by examiner

POWER MODULE AND DC-DC CONVERTER

CROSS-REFERENCE TO RELATED APPLICATIONS

This is the U.S. national stage of application No. PCT/JP2018/033357, filed on Sep. 10, 2018, and priority under 35 U.S.C. § 119(a) and 35 U.S.C. § 365(b) is claimed from Japanese Application No. 2017-191841, filed on Sep. 29, 2017.

FIELD OF THE INVENTION

The present invention relates to a power module and a DC-DC converter.

BACKGROUND

Conventionally, there is known a technique of causing current flowing through a field effect transistor (for example, MOSFET (Metal-Oxide-Semiconductor Field-Effect Transistor)) mounted on a power supply circuit to pass through a shunt resistor, and measuring the current by detecting a voltage difference generated between both ends of the shunt resistor. In this case, accuracy of the current measurement is degraded due to an influence of a wiring pattern from the MOSFET to the shunt resistor. Examples of the influence of the wiring pattern include parasitic inductance, resistance and capacitance of the wiring and an influence of an external noise on the wiring.

In order to solve this problem, it is known that a Rogowski coil is mounted in a power device to detect a current flowing through the power supply circuit. A detector that detects whether the current flowing through the power supply circuit exceeds a predetermined threshold is known.

However, the conventional technique has a problem in that cost of the power supply circuit cannot be reduced because a relatively expensive Rogowski coil is used. In the conventional technique, magnitude of the current flowing through the power supply circuit cannot be detected.

SUMMARY

According to one aspect of the present invention, a power module includes: a first switching device; a current-voltage conversion circuit into which current output from the first switching device flows; a measurement circuit that measures magnitude of the current; and an output terminal that outputs an output signal indicating the magnitude of the current measured by the measurement circuit. The measurement circuit measures the magnitude of the current output from the first switching device based on a resistance value of the current-voltage conversion circuit, and the first switching device and the measurement circuit are implemented in one semiconductor package.

In the power module, the current-voltage conversion circuit may include a second switching device that is a switching device made of a material different from that of the first switching device, switching operation of the second switching device being slower than that of the first switching device.

In the power module, the first switching device and the second switching device may be cascode-connected to each other, and the measurement circuit may be made of a material identical to that of the second switching device.

In the power module, the first switching device may include gallium nitride (GaN) or silicon carbide (SiC), and be made of a material different from that of the second switching device.

In the power module, the measurement circuit may measure the magnitude of the current output from the first switching device based on a potential difference between both ends of the current-voltage conversion circuit, the potential difference being generated by on-resistance of the current-voltage conversion circuit.

The power module may further include a second switching device that is a switching device made of a material different from that of the first switching device, switching operation of the second switching device being slower than that of the first switching device, the second switching device being cascode-connected to the first switching device. The current-voltage conversion circuit may include: a third switching device that is a switching device that is turned on when the measurement circuit measures the magnitude of the current output from the first switching device, the third switching device causing part of the current to flow in a route connected in parallel with the second switching device in an on state; and a resistor connected in series to the third switching device, and the measurement circuit may measure the magnitude of the current output from the first switching device based on a potential difference between both ends of the resistor and a resistance value of the resistor.

In the power module, the current-voltage conversion circuit may include: a current supply unit that supplies current proportional to current flowing through the first switching device; and a resistor connected in series to the current supply unit, and the measurement circuit may measure the magnitude of the current output from the first switching device based on a potential difference between both ends of the resistor and a resistance value of the resistor.

According to another aspect of the present invention, a DC-DC converter includes: the power module described above; and a control device that outputs a control signal based on an output signal of the power module as a signal for controlling the first switching device included in the power module.

In the DC-DC converter, the control device may output the control signal based on magnitude of current measured by the power module.

The above and other elements, features, steps, characteristics and advantages of the present disclosure will become more apparent from the following detailed description of the preferred embodiments with reference to the attached drawings.

DETAILED DESCRIPTION

A first embodiment of the present invention will be described below with reference to the drawings. First, an outline of a power module 10 will be described with reference to FIG. 1.

Figure 1:
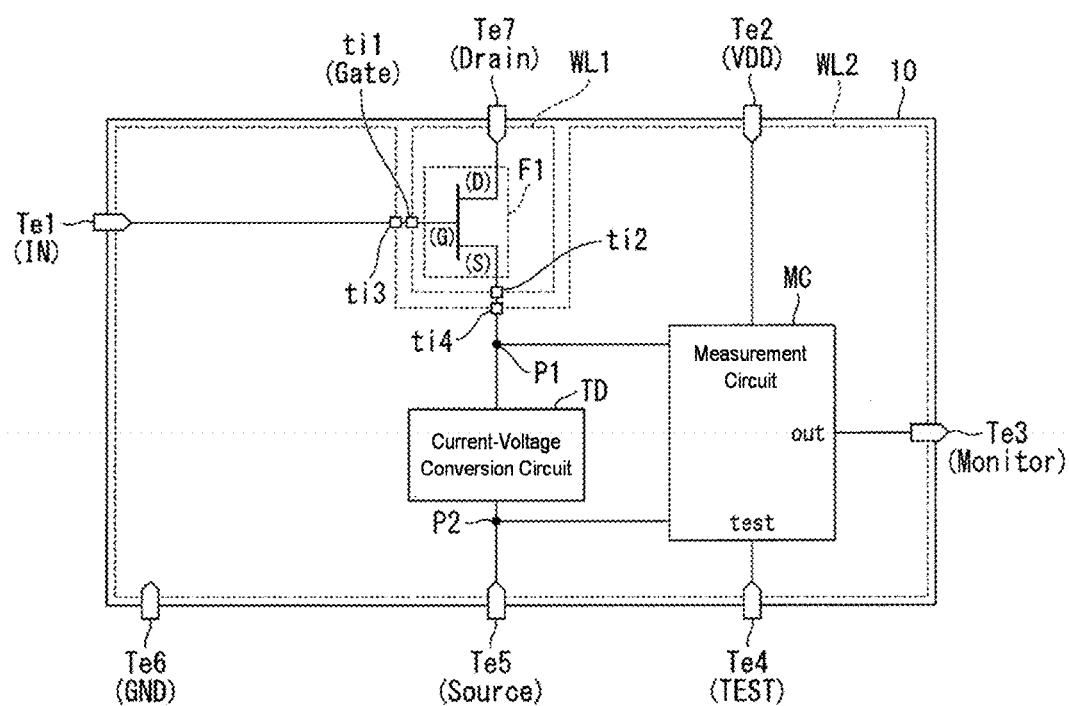
FIG. 1 is a view illustrating an outline of a power module.

FIG. 1 is a view illustrating the outline of the power module 10. For example, the power module 10 is made of two different types of materials. In the example of FIG. 1, the power module 10 is made of a first material WL1 and a second material WL2. The first material WL1 is a material such as gallium nitride (GaN) and silicon carbide (SiC). The second material WL2 is a material such as silicon (Si). In comparison between the first material WL1 and the second material WL2, the first material WL1 is a material having a wider band gap or higher electron mobility. The power module 10 includes an external terminal (hereinafter, referred to as an external terminal Te) connected to an external circuit. For example, the external terminal Te is an electrode. In the example of FIG. 1, the power module 10 includes external terminals Te1 to Te7. Among the external terminals Te, the external terminals Te1 to Te6 are disposed in the second material WL2, and the external terminal Te1 is disposed in the first material WL1. Electrode pads implemented on the first material WL1 and the second material WL2 in the power module 10 are connected to each other by bonding wires. In the following description, the electrode pad is also referred to as an internal terminal (hereinafter referred to as an internal terminal ti).

A first switching device F1 is implemented on the first material WL1. For example, the first switching device F1 is an FET (Field-Effect Transistor). The case where the first switching device F1 is a normally-on FET will be described below. The first switching device F1 includes a gate terminal, a source terminal, and a drain terminal. In the following description, the gate terminal, the drain terminal, and the source terminal included in the first switching device F1 are referred to as a first gate terminal, a first drain terminal, and a first source terminal, respectively. For example, the first switching device F1 is a device that switches large power at high speed based on a signal input to the first gate terminal. The first material WL1 includes two internal terminals ti (internal terminals ti1 to ti2). The first drain terminal is connected to the external terminal Te1. The first gate terminal is connected to the internal terminal ti1. The first source terminal is connected to the internal terminal ti2.

A measurement circuit MC is implemented on the second material WL2. The second material WL2 includes internal terminals ti3 and ti4. A gate driver GD (not illustrated) is a device that converts a PWM (pulse width modulation) signal generated by a control device (not illustrated) into a level at which the switching device is turned on. An output terminal of the gate driver GD and the external terminal Te1 of the power module 10 are connected to each other. Thus, a signal (hereinafter referred to as a gate signal) output from the output terminal of the gate driver GD is input to the external terminal Te1. The gate signal is a signal obtained by converting the PWM signal into a level at which the switching device is turned on. In the following description, sometimes signals (that is, the PWM signal and the gate signal) output from the control device (not illustrated) and input to the switching device are collectively referred to as a control signal. The external terminal Te1 is connected to the internal terminal ti3. The internal terminal ti3 and the internal terminal ti1 are connected to each other by a bonding wire. Thus, the gate signal output from the gate driver GD is input to the first gate terminal of the first switching device F1.

The measurement circuit MC is a circuit that measures current that flows when the first switching device F1 is on (hereinafter, referred to as a drain current). At this point, the internal terminal ti2 and the internal terminal ti4 are connected to each other by a bonding wire. The internal terminal ti4 and the external terminal Te5 are connected to each other by a wiring pattern implemented on the second material WL2. Thus, the drain current flows through the wiring pattern when the first switching device F1 is on. The measurement circuit MC measures the current based on a potential difference generated between both ends (points P1 and P2 illustrated in FIG. 1) of a current-voltage conversion circuit TD and a resistance value of the current-voltage conversion circuit TD. The measurement circuit MC outputs a signal indicating the measurement result (hereinafter, referred to as an output signal). For example, the output signal is a signal indicating a change in drain current in terms of voltage. The measurement circuit MC includes an output terminal (a terminal "out" in FIG. 1) and a test terminal (a terminal "test" in FIG. 1). The output terminal of the measurement circuit MC is connected to the external terminal Te3. Thus, the measurement circuit MC outputs the output signal as the measurement result measured from the external terminal Te3. The test terminal is connected to the external terminal Te4. The measurement circuit MC measures a drain current according to a signal (hereinafter, referred to as a test signal) input from the external terminal Te4.

The second material WL2 includes the external terminal Te2 to which voltage applied to the second material WL2 is connected and the external terminal Te6 that is a terminal on a GND side of the voltage. The circuit implemented on the second material WL2 is driven by voltage applied to the potential of the voltage applied to the second material WL2 (a potential VDD in FIG. 1).

Figure 2:
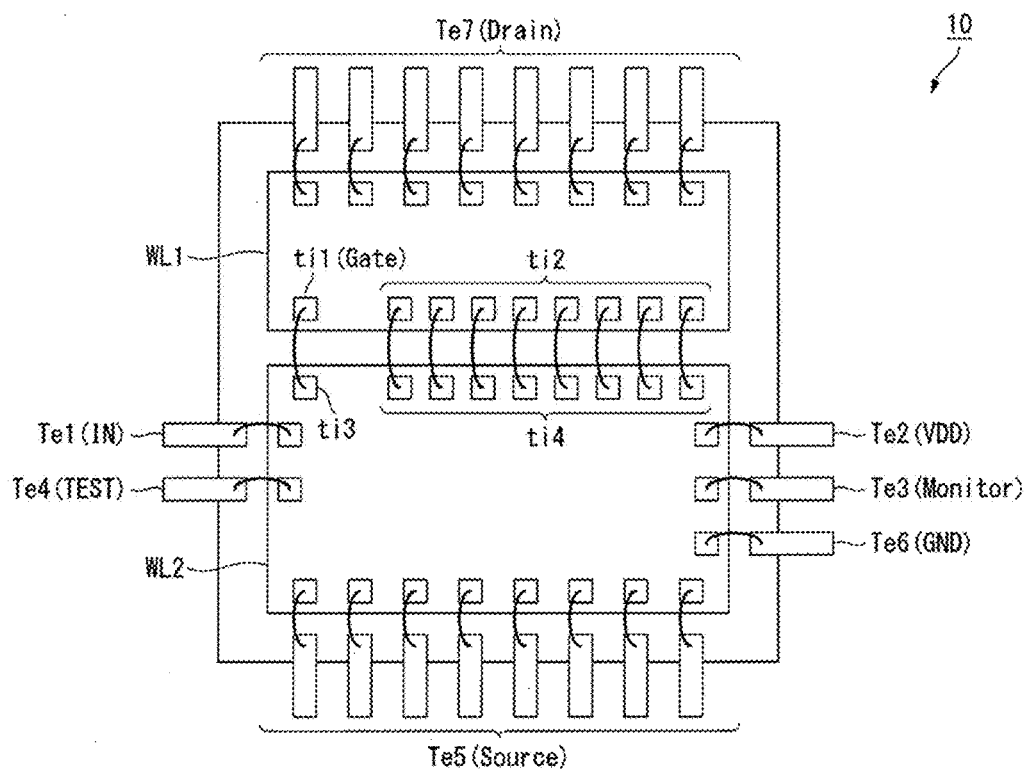
FIG. 2 is a view illustrating an example of internal connection of the power module.

FIG. 2 is a view illustrating an example of internal connection of the power module 10. A package of the power module 10 includes a circuit made of the first material WL1 and a circuit made of the second material WL2. The external terminals Te1 to Te6 of the power module 10 are connected to the electrode pads of the second material WL2 by bonding wires. The external terminal Te1 is connected to the electrode pad of the first material WL1 by a bonding wire. The terminal through which the drain current flows may include a plurality of electrodes and electrode pads. In the example of FIG. 2, each of the external terminal Te5 and the external terminal Te1 includes eight electrodes and eight electrode pads. Each of the internal terminal ti2 and the internal terminal ti4 includes eight electrode pads. Consequently, a larger drain current can flow through the external terminal Te5, the external terminal Te7, the internal terminal ti2, and the internal terminal ti4 as compared with the external terminal Te and the internal terminal ti that do not include the pluralities of electrodes and electrode pads.

By way of example, each of the external terminal Te5 and the external terminal Te1 includes the eight electrodes and eight electrode pads. However, the present invention is not limited to this case. The numbers of external terminals Te and electrode pads may be any number as long as the number corresponds to the current flowing through the external terminal Te. By way of example, each of the internal terminal ti2 and the internal terminal ti4 includes the eight electrode pads. However, the present invention is not limited to this case. The numbers of internal terminals ti and electrode pads may be any number as long as the number corresponds to the current flowing through the internal terminal ti.

A basic configuration of the power module 10 will be described below.

Figure 3:
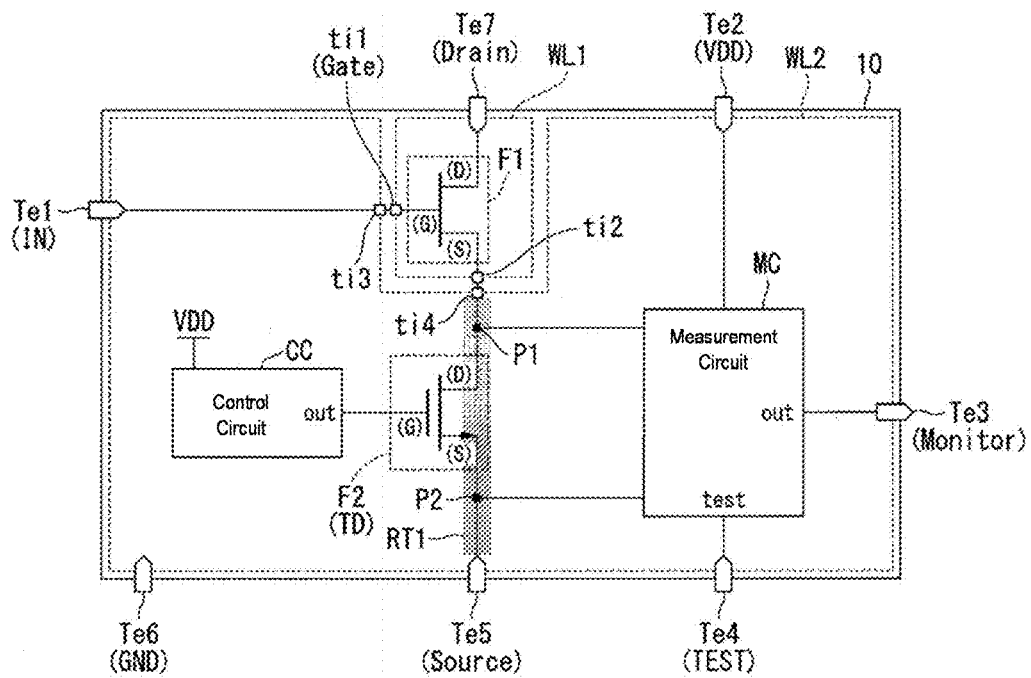
FIG. 3 is a view illustrating an example of a basic configuration of the power module.

FIG. 3 is a view illustrating an example of the basic configuration of the power module 10. Specifically, FIG. 3 is a view illustrating an example in which the current-voltage conversion circuit TD is a second switching device F2. In the example of FIG. 3, the second switching device F2 and a control circuit CC are implemented on the second material WL2 of the power module 10. For example, the second switching device F2 is a normally-off FET. In the following description, the gate terminal, the drain terminal, and the source terminal included in the second switching device F2 are referred to as a second gate terminal, a second drain terminal, and a second source terminal, respectively. In the example of FIG. 3, the second drain terminal and the internal terminal ti4 are connected to each other. The second source terminal and the external terminal Te5 are connected to each other. Thus, the first switching device F1 and the second switching device F2 are cascode-connected to each other. For example, the second switching device F2 is a device that performs switching operation based on a signal (hereinafter, referred to as a control signal) input to the second gate terminal.

The control circuit CC includes an output terminal (a terminal "out" in FIG. 3) that outputs the control signal. The output terminal and the second gate terminal of the second switching device F2 are connected to each other. Thus, the second switching device F2 performs the switching operation based on the control signal output from the control circuit CC.

As described above, the first switching device F1 is the normally-on device, so that the first switching device F1 cannot be turned off based on the signal output from the normally-off device typically used in a switching power supply device or the like. At this point, when the normally-on first switching device F1 is turned off, the second drain terminal of the normally-off second switching device F2 is connected to the first source terminal to form a cascode circuit (for example, FIG. 3). Consequently, when the second switching device F2 is turned off based on the control signal of the control circuit CC, the first switching device F1 is turned off similarly to the second switching device F2.

In the example of FIG. 3, the drain current flows from the internal terminal ti4 to the external terminal Te5 through the second drain terminal and the second source terminal (a route RT1 in FIG. 3) when the first switching device F1 is on. For example, the measurement circuit MC measures the drain current flowing between the second drain terminal and the second source terminal (that is, between the point P1 and the point P2 in FIG. 3) in the route RT1. The measurement circuit MC outputs the signal indicating the measurement result.

The power module 10 of the first embodiment (hereinafter, referred to as a power module 10a) will be described in detail below.

Figure 4:
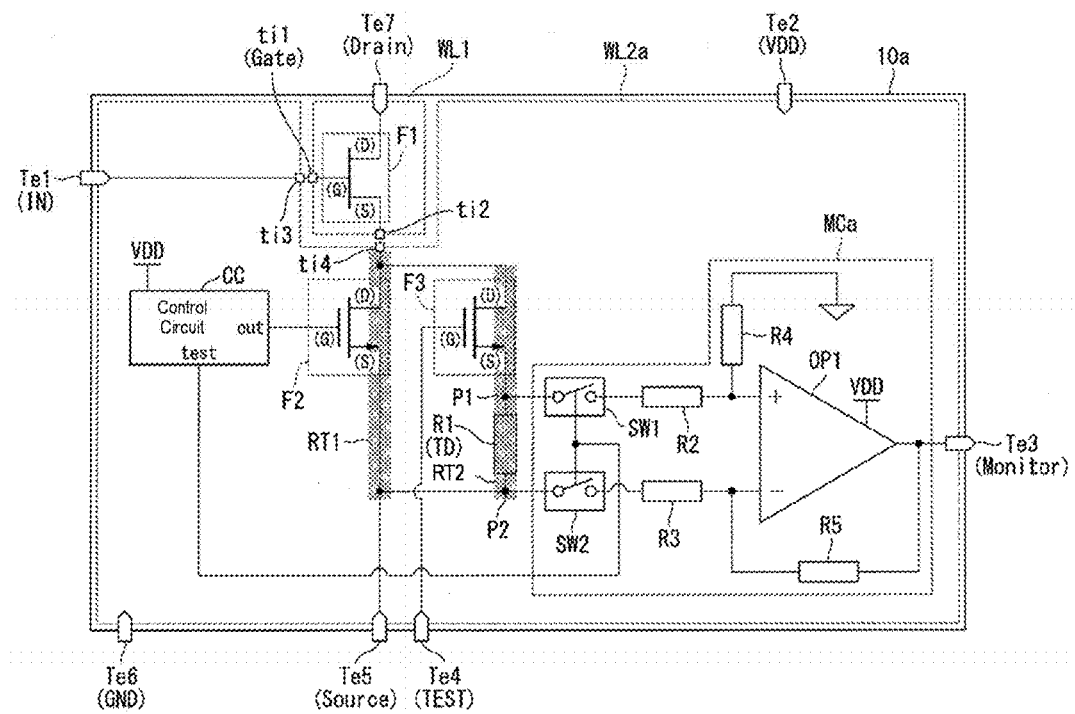
FIG. 4 is a view illustrating an example of a configuration of a power module according to a first embodiment.

FIG. 4 is a view illustrating an example of the configuration of the power module 10a according to the first embodiment. Specifically, FIG. 4 is a view illustrating an example of the configuration in which the current-voltage conversion circuit TD includes a third switching device F3 and a shunt resistor R1. The power module 10a of the first embodiment is made of the first material WL1 and a second material WL2a. The second switching device F2, the control circuit CC, the third switching device F3, the shunt resistor R1, and a measurement circuit MCa are implemented on the second material WL2a. In the first embodiment, the gate driver GD is provided outside the semiconductor package. Alternatively, the gate driver GD may be provided in one semiconductor package.

For example, the third switching device F3 is a normally-off FET. In the following description, the gate terminal, the drain terminal, and the source terminal included in the third switching device F3 are referred to as a third gate terminal, a third drain terminal, and a third source terminal, respectively. The internal terminal ti4, the second drain terminal, and the third drain terminal are connected to one another. The third gate terminal and the external terminal Te4 are connected to each other. The third source terminal is connected to one end of the shunt resistor R1. The other end of the shunt resistor R1, the second source terminal, and the external terminal Te5 are connected to one another.

In the example of FIG. 4, the control circuit CC includes a test terminal (a terminal "test" in FIG. 4). The control circuit CC is connected to the external terminal Te4. The control circuit CC outputs the control signal according to the test signal input from the external terminal Te4, and controls the second switching device F2 to be in an on state or an off state.

The measurement circuit MCa includes an operational amplifier OP1, a switch SW1, a switch SW2, a resistor R2, a resistor R3, a resistor R4, and a resistor R5. Each of the switch SW1 and the switch SW2 includes two terminals, and switches the connection between the terminals by opening and closing. One end of the switch SW1 is connected to a connection point (point P1 in FIG. 4) between the third source terminal and the shunt resistor R1, and the other end is connected to the resistor R2. One end of the switch SW2 is connected to a connection point (point P2 in FIG. 4) among the second source terminal, the other end of the shunt resistor R1, and the external terminal Te5, and the other end of the switch SW2 is connected to the resistor R3. The switch SW1 and the switch SW2 are connected to the external terminal Te4. The switch SW1 and the switch SW2 open and close according to the test signal. The other end of the resistor R2 is connected to a non-inverting input terminal of the operational amplifier OP1. The other end of the resistor R3 is connected to an inverting input terminal of the operational amplifier OP1. One end of the resistor R4 is connected to the non-inverting input terminal, and the other end is grounded. One end of the resistor R5 is connected to the inverting input terminal, and the other end is connected to the output terminal of the operational amplifier OP1. The output terminal of the operational amplifier OP1 is connected to the external terminal Te3.

In the first embodiment, the power module 10 operates in a normal mode and a test mode. In the normal mode, for example, the test signal is a low-level signal. In the normal mode, the control circuit CC controls the second switching device F2 as the switching device that controls the first switching device F1 to be in the on state or the off state. In the normal mode, the third switching device F3 is controlled to be in the off state in response to the input of the low-level test signal. In the normal mode, the measurement circuit MCa does not measure the drain current of the first switching device F1. Specifically, the switch SW1 and the switch SW2 are controlled to be in an open state in response to the input of the low-level test signal. Thus, in the normal mode, the signal is not input to the inverting input terminal and the non-inverting input terminal of the operational amplifier OP1.

In the test mode, for example, the test signal is a high-level signal. In the test mode, the control circuit CC controls the second switching device F2 to be in the off state. In the test mode, the third switching device F3 is controlled to be in the on state in response to the input of the high-level test signal. Thus, in the test mode, the drain current of the first switching device F1 flows from the internal terminal ti4 to the external terminal Te5 through the third drain terminal, the third source terminal, and the shunt resistor R1 (a route RT2 in FIG. 4). The route RT1 and the route RT2 are routes connected in parallel to each other.

In the test mode, the measurement circuit MCa measures the drain current of the first switching device F1. Specifically, the switch SW1 and the switch SW2 are controlled to be in a closed state in response to the input of the high-level test signal. In this case, the measurement circuit MCa outputs the voltage, in which the potential difference (in this example, the potential difference (that is, the potential difference between the point P1 and the point P2) generated by the shunt resistor R1) generated between the inverting input terminal and the non-inverting input terminal of the operational amplifier OP1 is amplified using a gain determined by the resistance values of the resistors R2 to R5, from the output terminal.

As described above, the power module 10 of the first embodiment includes the first switching device F1, the current-voltage conversion circuit TD into which the current (in this example, the drain current) output from the first switching device F1 flows, and the measurement circuit MC that measures the magnitude of the current (in this example, the drain current), the measurement circuit MC is based on the resistance value of the current-voltage conversion circuit TD measures the magnitude of the current output from the first switching device F1, and the first switching device F1 and the measurement circuit MC are implemented in one semiconductor package. In the conventional technique, sometimes the drain current is hardly measured with high accuracy due to the influence of the wiring pattern from the first switching device F1 to the shunt resistor. In the power module 10 of the first embodiment, the first switching device F1 and the measurement circuit MC are implemented in the same package. For this reason, the power module 10 of the first embodiment can reduce a measurement error caused by the influence of the wiring pattern. Thus, the power module 10 of the first embodiment can accurately measure the current with no use of the expensive component (for example, a Rogowski coil).

The current-voltage conversion circuit TD of the power module 10 of the first embodiment includes the second switching device F2 that is the switching device made of the material different from the first switching device F1, and the switching operation of the second switching device F2 is slower than that of the first switching device F1. In the power module 10 of the first embodiment, the first switching device F1 and the second switching device F2 are cascode-connected to each other, and the measurement circuit MC is made of the same material as the second switching device F2 (in this example, silicon (Si)). At this point, the first switching device F1 having the high switching speed is typically the normally-on FET. In this case, the first switching device F1 cannot be turned off based on the signal output from the normally-on device typically used in the switching power supply device or the like. In the power module 10 of the first embodiment, the second switching device F2 is cascode-connected to the first switching device F1, and the second switching device F2 is turned off, whereby the first switching device F1 can be controlled to be in the off state.

In the power module 10 of the first embodiment, the first switching device F1 is made of the material that includes gallium nitride (GaN) or silicon carbide (SiC) and is different from the material (in this example, silicon (Si)) for the second switching device F2. In the switching device (for example, the first switching device F1) made of the first material WL1 and the switching device (for example, the second switching device F2) made of the second material WL2, the switching device made of the first material WL1 can perform the switching operation at a high speed while the large drain current flows therethrough. Thus, in the power module 10 of the first embodiment, the switching device (in this example, the first switching device F1) is made of the first material WL1 of gallium nitride (GaN) or silicon carbide (SiC), which allows the switching operation to be performed at a high speed while the large drain current flows through the switching device.

The power module 10a of the first embodiment further includes the third switching device F3 that is the switching device, which is brought into the on state when the measurement circuit MC measures the magnitude of the current (in this example, the drain current) output from the first switching device F1, and is the switching device that causes at least part of the drain current to flow through the route RT2 connected in parallel to the second switching device F2 while the third switching device is in the on state and the resistor (in this example, the shunt resistor R1) connected in series to the third switching device F3, and the measurement circuit MCa measures the magnitude of the current output from the first switching device F1 based on the potential difference between both ends of the shunt resistor R1 and the resistance value of the shunt resistor R1. Consequently, the power module 10a of the first embodiment can measure the drain current of the first switching device F1 with the simple circuit configuration.

The power module 10 of the second embodiment (hereinafter, referred to as a power module 10b) will be described in detail below. The same components as those of the first embodiment are denoted by the same reference numerals, and the description thereof is omitted.

Figure 5:
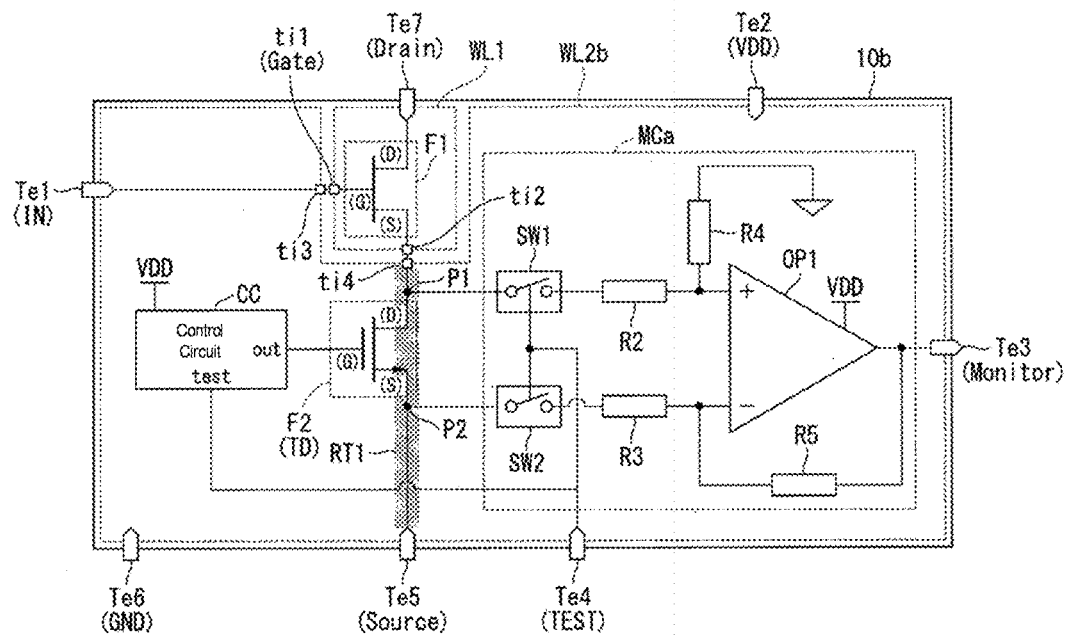
FIG. 5 is a view illustrating an example of a configuration of a power module according to a second embodiment.

FIG. 5 is a view illustrating an example of the configuration of the power module 10b according to the second embodiment. Specifically, FIG. 5 is a view illustrating an example in which the current-voltage conversion circuit TD is the second switching device F2. The power module 10b of the second embodiment is made of the first material WL1 and a second material WL2b. The second switching device F2, the control circuit CC, and the measurement circuit MCa are implemented on the second material WL2b. In the second embodiment, the gate driver GD is provided outside the semiconductor package. Alternatively, the gate driver GD may be provided in one semiconductor package.

The control circuit CC of the second embodiment controls the second switching device F2 as the switching device that controls the first switching device F1 to be in the off state or the on state regardless of the normal mode and the test mode.

In one example of FIG. 5, one end of the switch SW1 is connected to the connection point (point P1 in FIG. 5) between the internal terminal ti4 (first source terminal) and the second drain terminal. One end of the switch SW2 is connected to the connection point (point P2 in FIG. 5) between the second source terminal and the external terminal Te5. In the normal mode, the measurement circuit MCa does not measure the drain current of the first switching device F1. Specifically, the switch SW1 and the switch SW2 are controlled to be in the open state in response to the input of the low-level test signal. Thus, in the normal mode, the signal is not input to the inverting input terminal and the non-inverting input terminal of the operational amplifier OP1. In the test mode, the measurement circuit MCa measures the drain current of the first switching device F1. Specifically, the switch SW1 and the switch SW2 are controlled to be in a closed state in response to the input of the high-level test signal. In this case, the measurement circuit MCa outputs the voltage, in which the potential difference (in this example, the potential difference (that is, the potential difference between the point P1 and the point P2) generated between the inverting input terminal and the non-inverting input terminal of the operational amplifier OP1) generated between the inverting input terminal and the non-inverting input terminal of the operational amplifier OP1 is amplified using a gain determined by the resistance values of the resistors R2 to R5, from the output terminal. The potential difference generated between the second drain terminal and the second source terminal is a potential difference generated by on-resistance of the second switching device F2.

As described above, in the power module 10a of the second embodiment, the measurement circuit MCa measures the magnitude of the current (in this example, the drain current) output from the first switching device F1 based on the potential difference between both ends (in this example, between the second drain terminal and the second source terminal) of the second switching device F2, the potential difference being generated by the on-resistance of the second switching device F2. Consequently, the power module 10a of the second embodiment can measure the drain current of the first switching device F1 with the simple circuit configuration that does not include the shunt resistor R1.

The power module 10 of a third embodiment (hereinafter, referred to as a power module 10c) will be described in detail below. The same components as those of the first embodiment and the second embodiment are denoted by the same reference numerals, and the description thereof is omitted.

Figure 6:
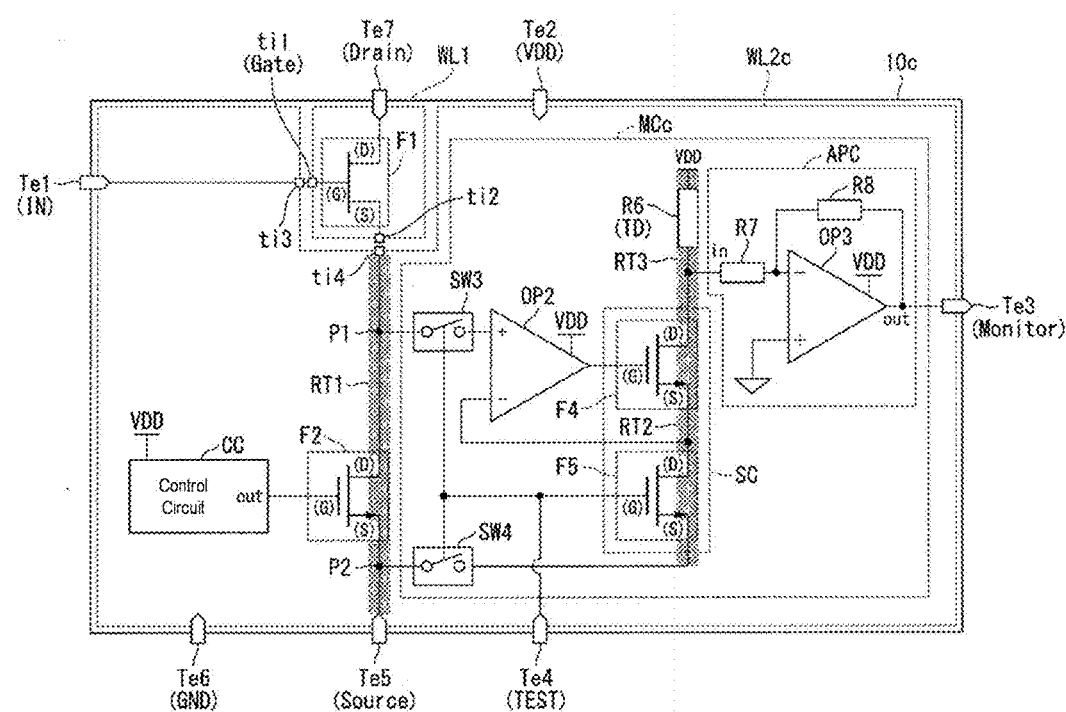
FIG. 6 is a view illustrating an example of a configuration of a power module according to a third embodiment.

FIG. 6 is a view illustrating an example of the configuration of the power module 10c according to the third embodiment. Specifically, FIG. 6 is a diagram illustrating an example of a configuration in which the current-voltage conversion circuit TD includes a shunt resistor R6, a fourth switching device F4, and a fifth switching device F5. The power module 10c of the third embodiment is made of the first material WL1 and a second material WL2c. The second switching device F2, the control circuit CC, and a measurement circuit MCc are implemented on the second material WL2c. In the second embodiment, the gate driver GD is provided outside the semiconductor package. Alternatively, the gate driver GD may be provided in one semiconductor package.

The measurement circuit MCc includes an operational amplifier OP2, a switch SW3, a switch SW4, the fourth switching device F4, the fifth switching device F5, the shunt resistor R6, and an inverting amplifier circuit APC. For example, the fourth switching device F4 and the fifth switching device F5 are FETs. An FET in which a ratio of gate widths of the second switching device F2 and the fifth switching device F5 becomes, for example, 1000:1 is selected as the fifth switching device F5. However, the ratio of the gate width is not limited to this configuration. In the following description, the gate terminal, the drain terminal, and the source terminal included in the fourth switching device F4 are referred to as a fourth gate terminal, a fourth drain terminal, and a fourth source terminal, respectively. The gate terminal, the drain terminal, and the source terminal included in the fifth switching device F5 are referred to as a fifth gate terminal, a fifth drain terminal, and a fifth source terminal, respectively. Each of the switch SW3 and the switch SW4 includes two terminals, and switches the connection between the terminals by opening and closing. One end of the switch SW3 is connected to the connection point (point P1 in FIG. 6) between the internal terminal ti4 (first drain terminal) and the second drain terminal. The other end of the switch SW3 is connected to the non-inverting input terminal of the operational amplifier OP2. One end of the switch SW4 is connected to the connection point (point P2 in FIG. 6) between the second source terminal and the external terminal Te5. The other end of the switch SW4 is connected to the fifth source terminal. The switch SW3 and the switch SW4 are connected to the external terminal Te4. The switch SW3 and the switch SW4 open and close according to the test signal.

One end of the shunt resistor R6 is connected to a potential (the potential VDD in FIG. 6) of the voltage applied to the second material WL2c. The other end of the shunt resistor R6 is connected to the input terminal of the inverting amplifier circuit APC and the fourth drain terminal. The fourth source terminal, the fifth drain terminal, and the inverting input terminal of the operational amplifier OP2 are connected to one another. The fifth gate terminal of the fifth switching device F5 and the external terminal Te4 are connected to each other.

The control circuit CC of the second embodiment controls the second switching device F2 as the switching device that controls the first switching device F1 to be in the off state or the on state regardless of the normal mode and the test mode.

The inverting amplifier circuit APC includes an operational amplifier OP3, a resistor R7, and a resistor R8. The inverting amplifier circuit APC includes the input terminal (a terminal "input" in FIG. 6) and the output terminal (a terminal "out" in FIG. 6). One end of the resistor R7 is connected to the input terminal. The other end of the resistor R7, one end of the resistor R8, and the inverting input terminal of the operational amplifier OP3 are connected to one another. The non-inverting input terminal of the operational amplifier OP3 and the other end of the resistor R8 are grounded. The output terminal of the operational amplifier OP3 and the output terminal of the inverting amplifier circuit APC are connected to each other. The output terminal of the inverting amplifier circuit APC and the external terminal Te3 are connected to each other.

In the third embodiment, the power module 10c operates in the normal mode and the test mode. In the normal mode, for example, the test signal is a low-level signal. In the normal mode, the fifth switching device F5 is controlled to be in the off state in response to the input of the low-level test signal to the fifth gate terminal. In the normal mode, the measurement circuit MCa does not measure the drain current of the first switching device F1. Specifically, the switch SW1 and the switch SW2 are controlled to be in the open state in response to the input of the low-level test signal, the signal is not input to the measurement circuit MCc (operational amplifier OP2), and the output signal is not output.

In the test mode, for example, the test signal is a high-level signal. The switch SW3 and the switch SW4 are controlled to be in the closed state in response to the input of the high-level test signal. In the test mode, the fifth switching device F5 is controlled to be in the on state in response to the input of the high-level test signal. The operational amplifier OP2 of the measurement circuit MCc outputs the voltage corresponding to the potential difference generated between the point P1 and the point P2 from the output terminal. The voltage corresponding to the potential difference is applied to the fourth gate terminal of the fourth switching device F4, and the drain current corresponding to the potential difference flows between the fourth drain terminal of the fourth switching device F4 and the fourth source terminal. The drain current flows from the shunt resistor R6 to the external terminal Te5 through the fourth drain terminal, the fourth source terminal, the fifth drain terminal, and the fifth source terminal (a route RT3 in FIG. 6). As described above, for example, the ratio of the gate widths of the second switching device F2 and the fifth switching device F5 is set to 1000:1. Thus, the drain current flowing through the route RT3 is a current that is proportional to the drain current flowing through the route RT1, and is a current having magnitude of 1/1000 of the drain current flowing through the route RT1. The fourth switching device F4 and the fifth switching device F5 are examples of the current supply unit. In the above description, by way of example, the ratio of the gate widths of the second switching device F2 and the fifth switching device F5 is set to 1000:1. However, the present invention is not limited to this configuration. At this point, preferably a power loss consumed by the flow of the current flowing through the route RT3 through the shunt resistor R6 is relatively small. The ratio of the gate widths of the second switching device F2 and the fifth switching device F5 may be set to any value as long as the power loss is relatively small.

As described above, in the test mode, in this example, the drain current having the magnitude of 1/1000 of the drain current flowing through the route RT1 flows through the route RT3. The potential difference (that is, the potential difference corresponding to the potential difference between the point P1 and the point P2) corresponding to the drain current is generated between both ends of the shunt resistor R6. The operational amplifier OP3 of the inverting amplifier circuit APC outputs the voltage obtained by inverting and amplifying the potential difference by the gain determined by the resistance values of the resistors R7 and R8 from the output terminal. The inverting amplifier circuit APC may perform the non-inverting amplification on the potential difference instead of the inverting amplification.

As described above, in the power module 10c of the present embodiment, the current-voltage conversion circuit TD includes the current supply unit (this example the fourth switching device F4 and the fifth switching device F5) that supplies the current proportional to the current (in this example, the drain current) flowing through the first switching device F1 and the resistor (in this example, the shunt resistor R6) connected in series to the current supply unit, and the measurement circuit MCc measures the magnitude of the current output from the first switching device F1 based on the potential difference between both ends of the shunt resistor R6 and the resistance value of the shunt resistor R6.

In the test mode, sometimes the power is lost due to the heat when the whole drain current flows through the shunt resistor (for example, the shunt resistor R1 in FIG. 4). On the other hand, in the power module 10c of the third embodiment, the gate widths of the second switching device F2 and the fifth switching device F5 are adjusted, and the current (in this example, 1/1000) proportional to the drain current flowing through the route RT1 flows through the route RT3. Thus, according to the power module 10c of the third embodiment, a small amount of current corresponding to (proportional to) the drain current flowing through the first switching device F1 flows through the shunt resistor R6, which allows the decrease of the power loss associated with current measurement. When the drain current is measured based on the on-resistance of the second switching device F2, after the second switching device F2 is implemented on the second material WL2, it is necessary to measuring the on-resistance of the second switching device F2 to acquire the resistance value. On the other hand, in the power module 10c of the third embodiment, the current is measured by the potential difference generated between both ends of the shunt resistor R6, so that the drain current can be measured with higher accuracy as compared with the case of measuring the current based on the on-resistance of the second switching device F2.

A DC-DC converter 1 according to a fourth embodiment will be described below. The same components as those in the first embodiment, the second embodiment, and the third embodiment are denoted by the same reference numerals, and the description thereof is omitted.

Figure 7:
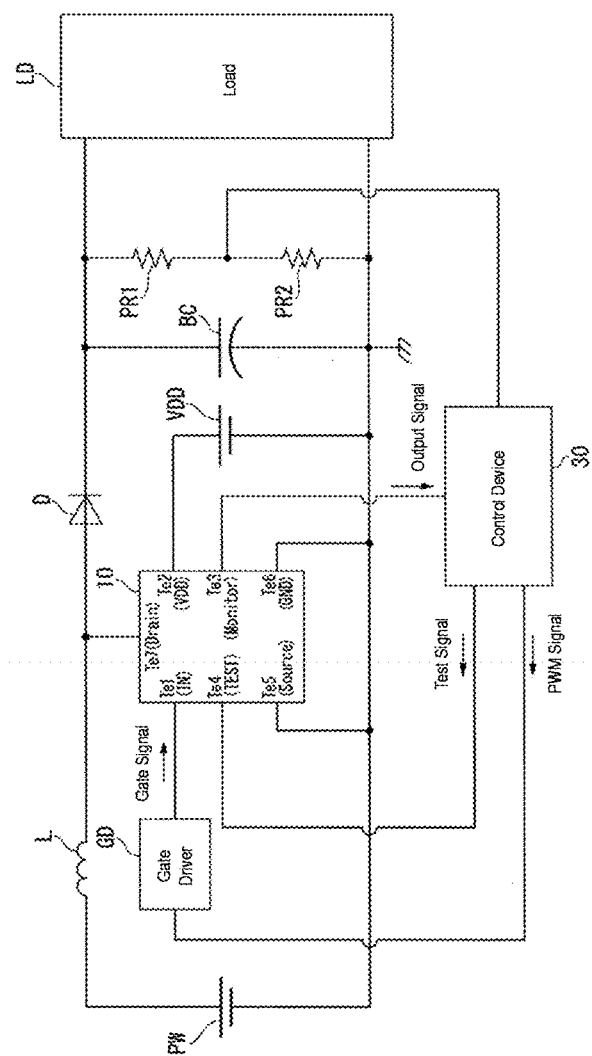
FIG. 7 is a view illustrating an example of a configuration of a DC-DC converter according to a fourth embodiment.

FIG. 7 is a view illustrating an example of a configuration of the DC-DC converter 1 according to the fourth embodiment. The DC-DC converter 1 of the fourth embodiment includes the power module 10 that is any one of the power module 10a, the power module 10b, and the power module 10c, a constant voltage source PW, an inductor L, a diode D, a capacitor BC, A first voltage dividing resistor PR1, a second voltage dividing resistor PR2, a load LD, and a control device 30. The external terminal Te1 and the gate driver GD are connected to each other. The potential VDD is applied to the external terminal Te2. The external terminal Te3 and the control device 30 are connected to each other. The power module 10 outputs the output signal from the external terminal Te3 to the control device 30. The control device 30 and the external terminal Te4 are connected to each other. The control device 30 inputs the test signal to the power module 10 (external terminal Te4). The control device 30 and the gate driver GD are connected to each other. The control device 30 inputs the PWM signal to the gate driver GD. The gate driver GD and the external terminal Te1 are connected to each other. The gate driver GD inputs the gate signal to the power module 10 (external terminal Te1). The external terminal Te5 and the external terminal Te6 are grounded. The potential VDD is applied to the external terminal Te1 through the inductor L. An anode of the diode D is connected to the external terminal Te7. One end of the load LD is connected to a cathode of the diode D. The other end of the load LD is grounded. The first voltage dividing resistor PR1 and the second voltage dividing resistor PR2 are connected in series to each other. The series-connected first voltage dividing resistor PR1 and second voltage dividing resistor PR2 are connected in parallel to the load LD. The capacitor BC is connected in parallel to the load LD. The signal switching the first switching device F1 is applied to the load LD. The control device 30 controls the operation of the power module 10 based on the output signal output from the power module 10. Specifically, when the output signal indicates that the drain current that becomes the overcurrent flowing through the load LD, the control device 30 inputs the PWM signal stopping the switching to the gate driver GD.

The potential VDD may be applied to the external terminal Te4 when the second switching device F2 operates as the switching device that controls the first switching device F1 to be in the off state or the on state regardless of the normal mode and the test mode, and when the second switching device F2 continues keeping the first switching device F1 is the on state.

As described above, the DC-DC converter 1 of the fourth embodiment includes the power module 10, the control device 30 that outputs the control signal based on the output signal of the power module 10 as the signal (in this example, the PWM signal for controlling the gate driver GD) controlling the first switching device F1 included in the power module 10, and the power conversion circuit that outputs the input power while converting the input power by the switching operation of the first switching device F1. The control device 30 of the fourth embodiment outputs the control signal based on the magnitude of the current measured by the power module 10. In the above description, the control device 30 outputs the PWM signal as an example of the control signal for controlling the switching device. Alternatively, the control device 30 may output a PAM signal instead of the PWM signal. In the conventional technique, the drain current is measured by the power module, and sometimes only binarized information indicating whether the measured current is the overcurrent can be output. In the DC-DC converter 1 of the fourth embodiment, the control device 30 can use the output signal, which is output from the power module 10 and corresponds to the change in drain current, to control the first switching device F1.

In the above description, by way of example, the power module 10 is made of two different types of materials (in this example, the first material WL1 and the second material WL2). However, the present invention is not limited to this configuration. For example, the power module 10 may be made of the first material WL1. In this case, each circuit implemented on the second material WL2 is implemented on the first material WL1.

The configurations in the above embodiments and each modification may be appropriately combined as long as they do not contradict each other.

The invention claimed is:

1. A power module comprising:
    a first switching device comprising a first material;
    a current-voltage conversion circuit into which current output from the first switching device flows, the current-voltage conversion circuit comprising a second switching device, the second switching device comprising a second material;
    a measurement circuit that measures magnitude of the current output, the measurement circuit comprising the second material; and
    an output terminal, wherein the output terminal outputs an output signal indicating the magnitude of the current output measured by the measurement circuit,
    wherein the measurement circuit measures the magnitude of the current output from the first switching device based on a resistance value of the current-voltage conversion circuit, and the first switching device and the measurement circuit are implemented in one semiconductor package,
    wherein a switching operation of the second switching device is slower than a switching operation of the first switching device, and the first switching device and the second switching device are cascode-connected to each other.

2. The power module according to claim 1, wherein the first material includes gallium nitride (GaN) or silicon carbide (SiC), and the second material includes silicon (Si).

3. The power module according to claim 1, wherein the measurement circuit measures the magnitude of the current output from the first switching device based on a potential difference between both ends of the current-voltage conversion circuit, the potential difference being generated by on-resistance of the current-voltage conversion circuit.

4. The power module according to claim 1, further comprising a second switching device that is a switching device made of a material different from that of the first switching device, switching operation of the second switching device being slower than that of the first switching device, the second switching device being cascode-connected to the first switching device,
    wherein the current-voltage conversion circuit includes:
    a third switching device that is a switching device that is in an on state while the measurement circuit measures the magnitude of the current output from the first switching device, the third switching device causing part of the current to flow in a route connected in parallel with the second switching device while the third switching device is in the on state; and
    a resistor connected in series to the third switching device, and
    the measurement circuit measures the magnitude of the current output from the first switching device based on a potential difference between both ends of the resistor and a resistance value of the resistor.

5. The power module according to claim 1, wherein the current-voltage conversion circuit includes:
    a current supply unit that supplies current proportional to current flowing through the first switching device; and
    a resistor connected in series to the current supply unit, and
    the measurement circuit measures the magnitude of the current output from the first switching device based on a potential difference between both ends of the resistor and a resistance value of the resistor.

6. A DC-DC converter comprising:
    the power module according to claim 1; and
    a control device that outputs a control signal based on an output signal of the power module as a signal for controlling the first switching device included in the power module.

7. The DC-DC converter according to claim 6, wherein the control device outputs the control signal based on magnitude of current measured by the power module.

* * * * *